(12) United States Patent
Koellnberger et al.

(10) Patent No.: US 9,034,139 B2
(45) Date of Patent: May 19, 2015

(54) TEMPORARY ADHESION OF CHEMICALLY SIMILAR SUBSTRATES

(75) Inventors: Andreas Koellnberger, Kirchdorf (DE); Frank Achenbach, Simbach (DE)

(73) Assignee: Wacker Chemie AG, Munich (DE)

( * ) Notice: Subject to any disclaimer, the term of this patent is extended or adjusted under 35 U.S.C. 154(b) by 0 days.

(21) Appl. No.: 14/233,071

(22) PCT Filed: Jul. 11, 2012

(86) PCT No.: PCT/EP2012/063601
§ 371 (c)(1),
(2), (4) Date: Jan. 15, 2014

(87) PCT Pub. No.: WO2013/013986
PCT Pub. Date: Jan. 31, 2013

(65) Prior Publication Data
US 2014/0150972 A1    Jun. 5, 2014

(30) Foreign Application Priority Data
Jul. 22, 2011   (DE) .................. 10 2011 079 687

(51) Int. Cl.
B29C 65/76  (2006.01)
C09J 5/00   (2006.01)
C09J 183/04 (2006.01)
H01L 21/683 (2006.01)
C08G 77/12  (2006.01)
C08G 77/20  (2006.01)

(52) U.S. Cl.
CPC . *B29C 65/76* (2013.01); *C09J 5/00* (2013.01); *C09J 183/04* (2013.01); *H01L 21/6835* (2013.01); *H01L 21/6836* (2013.01); *C09J 2203/326* (2013.01); *C09J 2205/302* (2013.01); *C09J 2483/00* (2013.01); *H01L 2221/68327* (2013.01); *H01L 2221/6834* (2013.01); *C08G 77/12* (2013.01); *C08G 77/20* (2013.01)

(58) Field of Classification Search
CPC ........................................... B29C 65/76
USPC ....................................... 156/325
See application file for complete search history.

(56) References Cited

U.S. PATENT DOCUMENTS

| | | | |
|---|---|---|---|
| 3,510,001 | A | 5/1970 | Baer et al. |
| 4,011,247 | A | 3/1977 | Sato et al. |
| 4,257,936 | A | 3/1981 | Matsumoto et al. |
| 5,312,855 | A | 5/1994 | Okami |
| 2001/0011117 | A1 | 8/2001 | Pesch et al. |
| 2004/0121618 | A1 | 6/2004 | Moore |
| 2005/0042462 | A1 | 2/2005 | Fehn et al. |
| 2007/0264510 | A1 | 11/2007 | Fehn et al. |
| 2008/0090380 | A1 * | 4/2008 | Gardner et al. ............ 438/455 |
| 2009/0176349 | A1 | 7/2009 | Jakob et al. |

FOREIGN PATENT DOCUMENTS

| | | |
|---|---|---|
| DE | 103 38 478 A1 | 3/2005 |
| DE | 10 2006 022 097 A1 | 11/2007 |
| EP | 0603514 A2 | 6/1994 |
| EP | 0875536 A2 | 11/1998 |
| EP | 0838086 B1 | 3/1999 |
| EP | 1510553 A1 | 3/2005 |
| EP | 1089326 B2 | 3/2007 |
| WO | 2004051708 A2 | 6/2004 |
| WO | 2006093639 A1 | 9/2006 |
| WO | 2009003029 A2 | 12/2008 |
| WO | 2009094558 A2 | 7/2009 |
| WO | 2011100030 A1 | 8/2011 |

* cited by examiner

*Primary Examiner* — Daniel Lee
(74) *Attorney, Agent, or Firm* — Brooks Kushman P.C.

(57) ABSTRACT

A temporary adhesive for reversibly bonding a silicon wafer to a silicon support contains a crosslinkable organopolysiloxanes composition and a fatty acid or salt thereof or fatty acid ester as a release regulator having a density different from the crosslinkable organopolysiloxanes composition of at least 0.1 g/cm$^3$, which upon parting of the wafer from the substrate, the adhesive remains substantially adhered to the substrate.

4 Claims, No Drawings

TEMPORARY ADHESION OF CHEMICALLY SIMILAR SUBSTRATES

CROSS-REFERENCE TO RELATED APPLICATIONS

This application is the U.S. National Phase of PCT Appln. No. PCT/EP2012/063601 filed Jul. 11, 2012, which claims priority to German application DE 10 2011 079 687.8 filed Jul. 22, 2011, the disclosures of which are incorporated in their entirety by reference herein.

BACKGROUND OF THE INVENTION

1. Field of the Invention

The present invention relates to the use of an adhesive based on crosslinkable silicone compositions for the temporary adhesive bonding of two chemically similar substrates. The term "temporary adhesive bonding" means that the substrates can be parted from one another again at a desired point in time. When the bond is parted, the adhesive layer remains almost completely on one of the two substrates, and so very little or no material of the adhesive layer requires removal by mechanical or chemical methods from the other substrate subsequently.

2. Description of the Related Art

In industrial operations, one requirement is for temporary adhesives between two chemically similar substrates that are to part specifically again from the desired substrate after use. Preference here is given to adhesive fracture between a substrate and the adhesive layer. Formulations used to date are capable of bonding two similar substrates, but without preferring one substrate. In accordance with the prior art, it has been possible so far to deliberately adjust the adhesive forces, by means of physical or chemical methods, only by way of pretreatment of the respective substrate. Examples of physical methods are abrading of the surface, UV irradiation, flame treatment, corona treatment, or plasma treatment. With pretreatment steps of these kinds, the surface or the near-surface layer of the substrate material is activated—that is, functional groups, primarily polar groups, are formed. Examples of chemical methods are pretreatment with adhesion-promoting additives (also called primers) or pretreatment with substances which prevent adhesion (also called release agents).

The market requirements from the fabricators of semiconductor components with regard to the chips to be fabricated, in particular, call for ever lower overall heights. One option for reducing the overall height of the shaped component is to make the wafers thinner. The grinding operation may be carried out before or after shape singularizing (dicing).

As a result of the wafers becoming increasingly large and increasingly thin, the structural strength of the wafer is reduced. As a result of this, the large, thin wafers may break when being worked on with the devices and materials that are commonly used, such as the dicing tapes that are nowadays used, for example, owing to insufficient mechanical support. Moreover, the wafer structures which protrude by up to 100 µm or more (bumps) may not be fully enclosed, without any voids, by the adhesive films (tapes) that are presently used, and so the voids which remain may lead in general, during vacuum working, to destruction or impairment of the thin wafer.

One possible technical solution to this problem is to bond the wafer to a hard substrate (for example, to another wafer or to a wafer support such as glass, for example) via a temporary adhesive layer, in order to increase the mechanical strength, and then to carry out the desired working operations, and finally to detach the wafer, which at this point has a thickness of only 10-100 µm, from the substrate again. The substrate attached via the adhesive serves here as a mechanical reinforcement during the grinding and downstream working operations.

Later working on the thinned wafer also includes the formation of resistant structures by plasma etching and operations such as, for example, metal plating and residue cleaning.

One possibility for fixing the semiconductor wafer on a support is represented by adhesive tapes. EP 0838086 B1 describes a tape composed of a thermoplastic elastomer block copolymer for use for the processing of semiconductor wafers. The limited elasticity of the material, however, leads to problems when wafers having surface structures (bumped wafers) are used. The thermoplastic properties of the material, moreover, lead to reduced heat stability, such stability being necessary for the back-side operations (plasma processes, CVD, etc.) that follow the thinning of the wafer (back-side grinding).

WO 2009/003029 A2 claims thermoplastic organic polymers (imides, amideimides, and amideimide-siloxanes) for use as a temporary adhesive between a wafer and a carrier.

WO 2009/094558 A2 describes the temporary adhesive bonding of a wafer and a carrier, the adhesive bond taking place not over the entire area but instead only in the edge region. Following a grinding operation and possible back-side operations, the adhesive bond is destroyed chemically, photochemically, thermally, or thermomechanically.

EP 0603514 A2 describes a method for thinning a semiconductor wafer, where the adhesive material used is suitable at most for temperatures of 200° C.

The US application US 2004/0121618 A1 describes a liquid adhesive which is suitable for spincoating operations and which consists of a thermoplastic polyurethane, and also dimethylacetamides and propylene glycol monomethyl ether as principal components.

EP 1089326 B1 claims a support for wafers that consists of a silicone elastomer covered with a dustproof film, the release force between the film and the silicone layer being from 5 to 500 g/25 mm (according to JIS K 6854). Also described is a method for producing a wafer support.

WO 2004/051708 A2 describes a method for the working of a wafer in which a release layer is applied between the front side of the wafer and the support layer (adhesive). The production of this release layer represents an additional step in the production chain, leading to prolonged working times and to higher production costs.

The major problem is that similar materials, such as, in this case, the previously processed silicon wafer, which on its surface may also contain materials other than silicon, is on the one hand to be joined firmly to a carrier, which likewise consists of silicon, using an adhesive layer, while on the other hand, after the steps that are customary in wafer processing, such as wafer grinding or thinning, coating, etc., for example, they are to be separated extremely simply and selectively at the wafer surface.

The systems used to date in accordance with the prior art are unsatisfactory for certain processing techniques such as, for example, the thermal deposition of silicon dioxide or high-temperature dielectrics, since the high-temperature stability of the polymers used is inadequate. In addition to the necessary temperature stability of up to more than 300° C., moreover, the correct balance and optimization of the formulation in respect of the mechanical parameters (during grinding of the wafer back), the chemical stability with respect to various chemicals customary in chip processing, the minimal release of volatile secondary products (risk of contamination), and the viscosity of the uncured adhesive (during application to the wafer) are important objectives in the development of a suitable material in the sandwich system under consideration.

Particularly within the semiconductor industry, therefore, there is a need for a selectively adhering adhesive for temporary adhesive bonding of two chemically similar substrates. The adhesive must be suitable for application by an industrially practicable process (for example, spray coating, printing, dipping, rotational coating), and at the desired point in time must be able to be parted from the desired substrate without residue by way of suitable methods. Furthermore, besides the supporting bond, e.g. a hard bond to the substrate, the adhesive is also to have certain elastic properties.

These requirements apply in particular for wafer bonding processes. The properties of the adhesive are to allow the processing of the wafer without breakage or damage to the latter, and are also to be able, furthermore, to enclose the front structures of the wafer in a supporting manner.

SUMMARY OF THE INVENTION

Surprisingly it has been found that objects are achieved by the use, according to the invention, of an adhesive, by means of which temporary and at the same time selective adhesive bonding between two chemically similar substrates is possible without pretreatment, the adhesive being a crosslinkable silicone composition which is characterized in that it comprises at least one adhesion regulator (A) selected from the group of adhesion promoters or release agents or a combination thereof, with the proviso that the adhesion regulator (A) is present in amounts such that the adhesive force or peel strength between the cured adhesive and a substrate is greater by at least 0.5 N/mm than the adhesive force between the cured adhesive and the other substrate, measured according to DIN ISO 813, and the cured adhesive can be parted adhesively on at least 80% of the area only from one substrate when the bond is parted.

DETAILED DESCRIPTION OF THE PREFERRED EMBODIMENTS

The crosslinkable silicone composition is preferably selected from the group containing condensation-crosslinking, addition-crosslinking, and peroxidically crosslinking silicone compositions.

A particularly advantageous feature of the invention is that the use of crosslinkable silicone compositions as adhesives allows a selectively adhesive assembly to be constructed between two chemically similar substrates, with no need for pretreatment of the substrates to be bonded.

The use of crosslinkable silicone compositions as adhesive allows a temporary wafer bonding process without the wafer breaking or becoming damaged. Application by industrial processes, for example by spray coating, printing, dipping, or rotational coating is readily possible, as is residue-free parting from the wafer at the desired point in time. The adhesive bond, furthermore, exhibits the desired mechanical properties of supporting bonding, i.e. firm bonding to the substrate, and elasticity, and is able to enclose the front structures of the wafer in a supporting manner.

Serving as a physical basis for the adhesive used in accordance with the invention may in principle be any curable silicone compositions that are based on any desired crosslinking mechanisms. The curing of the silicone composition, which converts the latter into a silicone elastomer, may be accomplished, for example, by exposure to electromagnetic radiation (e.g., microwaves, UV light, X-ray, or gamma radiation) or high-energy particles (e.g., electrons, protons, alpha particles). Curing of the silicone composition takes place preferably by the condensation crosslinking, addition crosslinking, or peroxidic crosslinking well known to the skilled person, although the intention is also to include the crosslinking mechanisms which are less familiar in industrial practice, examples being crosslinking by means of dehydrocondensation, thiol-ene reaction, and "click" reaction. Where the silicone composition is a thermoplastic silicone composition, the bonding of the substrates may be accomplished by prior melting of the silicone material—in this case, in other words, "curing" is to be understood to mean the cooling of the silicone material beneath its melting point (physical crosslinking). Curing may also be accomplished by a combination of the aforesaid crosslinking possibilities, as for example by UV-initiated, platinum-catalyzed hydrosilylation reaction.

The mechanical characteristics of the cured adhesive (hardness, modulus, resistance to tear continuation, tensile strength, rebound elasticity) are within the ranges known to the prior art. Depending on crosslinking system, the adhesive of the invention may take the form of a one-component or multicomponent formulation, the viscosity of the formulation being adapted to the application process (for example: spin-coating, injection molding, etc.) and being within the ranges known to the prior art. The range of 0.01-100 Pa·s is considered to be preferred, and the range from 0.1 to 10 Pa·s particularly preferred.

Suitable condensation-crosslinking silicone compositions are all silicone compositions known to date in the prior art. Typical representatives of this group of compounds are the condensation-crosslinking silicone compositions that can be found in the technical literature under the designations RTV-1 (Room Temperature Vulcanizing; 1-component) and RTV-2 (2-component). RTV-2 materials typically comprise, in one of the components, at least one organopolysiloxane having terminal silanol groups, and also further constituents such as fillers and plasticizers. The second component (the curing agent) comprises a crosslinker silane or siloxane in combination with a catalyst that accelerates the condensation reaction, and also, optionally, with further constituents such as plasticizers. Used in particular as crosslinker silane or siloxane, respectively, are the silanes and siloxanes that possess at least three hydrolyzable radicals. Those preferred are tri- or tetrafunctional alkoxysilanes, their partial hydrolyzates, or alkoxysiloxanes. Compounds established as effective condensation catalysts include organotin compounds, examples being dialkyltin dicarboxylates and tin(II)dicarboxylates, and organotitanium compounds. The condensation-crosslinking RTV-1 materials, which cure to a silicone elastomer on ingress of atmospheric moisture, with elimination of hydrolysis product, are based on the possibility of being able to endblock silanol-terminal organopolysiloxanes with a crosslinker comprising a plurality of hydrolyzable groups, without inducing crosslinking at the same time. The crosslinkers used may be all silanes that possess at least three hydrolyzable groups, or partial hydrolyzates of these silanes. According to the nature of the hydrolyzable group, distinctions are made, for example, between acetoxy, oxime, alkoxy, isoprenoxy, amide, amine, and amineoxy crosslinking systems, which crosslink with elimination of acetic acid, oxime, alcohol, acetone, amide, amine, or hydroxylamine. In order to achieve a sufficiently high rate of crosslinking, the majority of RTV-1 materials comprise a condensation catalyst, with organotin and organotitanium compounds being used with preference.

Suitable addition-crosslinking silicone compositions are all silicone compositions known to date in the prior art. In the simplest case they comprise at least one organopolysiloxane having at least two aliphatically unsaturated groups in the molecule (e.g., Si-bonded vinyl groups), and also at least one organohydrogenpolysiloxane having two or more SiH groups in the molecule and at least one catalyst which promotes the addition of Si-bonded hydrogen to aliphatic multiple bonds, this catalyst also being referred to as a hydrosilylation catalyst. Preferred hydrosilylation catalysts are compounds of platinum, although complexes of Rh, of Pd, and of Ru, for example, also exhibit high catalytic activity. One particularly preferred Pt catalyst is the Karstedt catalyst, a Pt(0)-divinyltetra-methyldisiloxane complex. Other constituents of addition-crosslinkable silicone materials include, for example, fillers, inhibitors (for setting an appropriate processing life and crosslinking rate), pigments, adhesion promoters, heat stabilizers, and the like.

Suitable peroxidically crosslinking silicone compositions are all peroxide-induced, radically crosslinking silicone compositions known to date in the prior art. In the simplest case they comprise at least one organopolysiloxane having at least 2 crosslinkable groups per molecule, such as methyl groups or vinyl groups, for example, and at least one suitable organic peroxide.

The adhesives used in accordance with the invention comprise adhesion regulators (A) in amounts of preferably 0.01 to 10 wt %, more preferably 0.1 to 5 weight percent, and more preferably 0.5 to 3 weight percent.

Where the adhesion regulator (A) used is an adhesion promoter, it is possible in principle to use all compounds which according to the prior art are considered adhesion promoters in silicone compositions. Examples of such adhesion promoters are silanes having hydrolyzable groups and SiC-bonded vinyl, acryloyloxy, methacryloyloxy, epoxy, acid-anhydride, acid, ester, or ether groups, and also their partial hydrolyzates and co-hydrolyzates, preference being given to silanes having vinyl groups and silanes having epoxy groups and comprising ethoxy or acetoxy groups as hydrolyzable radicals, particularly preferred examples being vinyltriethoxysilane, vinyltriacetoxysilane, epoxypropyltriethoxysilane, glycidyloxypropyltrimethoxysilane, methacryloyloxypropyltrimethoxysilane, methacryloyloxymethyltrimethoxysilane, and their partial hydrolyzates and cohydrolyzates.

Adhesion promoters of these kinds are disclosed explicitly in texts including those listed below, where they are used as part of noncrosslinked silicone materials which allow self-adhesion of the resulting silicone elastomer to various substrates. By way of example, European laid-open specification EP 0875536 A2 describes epoxy-functional alkoxysilanes and/or alkoxysiloxanes as adhesion promoters. Patent specification U.S. Pat. No. 4,257,936 sees adducts of acryloyltrialkoxysilanes with cyclic hydrogenpolysiloxanes acting as adhesion promoters. U.S. Pat. No. 4,011,247 discloses epoxy adducts of hydrogenpolysiloxanes, while patent specification U.S. Pat. No. 3,510,001 discloses alkoxysilane adducts of triallyl isocyanurate. U.S. Pat. No. 5,312,855 describes siloxane compounds having SiH and alkoxysilyl or glycidyl groups in combination with an organic compound having two or more allyl ester groups as adhesion improvers. DE 102006 022 097 A1 and DE 103 38 478 A1 describe specific Si—H-containing crosslinkers for the purpose of boosting the adhesion of silicone elastomers.

Another group of substances acting as adhesion promoters are the transition metal alkoxides and transition metal chelates, particularly those of the metals titanium and zirconium. They are able to develop their adhesion-promoting effect by means, for example, of hydrolyzable, condensable groups, or as a transesterification catalyst (more particularly in combination with alkoxy-functional silanes and hydroxy-functional polyorganosiloxanes). Examples thereof are titanium allylacetoacetate triisopropoxide, tetra-n-butyl titanate, titanium diisopropoxide (bis-2,4-pentanedionate), tetraoctyl titanate, cresyl titanate, titanyl acetoacetate, zirconium acetylacetonate, and zirconium n-propoxide. Aluminum chelates as well, such as aluminum acetylacetonate, may be used as adhesion promoters. The use of a combination of the aforesaid compounds may also be of advantage for the adhesion-promoting effect. The processes for preparing these adhesion promoters are prior art.

Use may additionally be made of unsaturated or epoxy-functional compounds as adhesion promoters, examples being 3-glycidyloxypropyl-alkoxy-alkylsilanes or (epoxycyclohexyl)-ethyl-alkoxy-alkylsilanes. Suitable for this purpose as well are unsaturated silanes which carry organic groups, such as, for example, 3-methacryloyloxypropylalkoxysilanes, 3-acryloyloxypropylalkoxysilanes, and vinyl-, allyl-, hexenyl-, or undecenylalkoxysilanes. Examples of epoxy-functional silanes are 3-glycidyloxypropyltrimethoxysilane, 3-glycidyloxypropyl-triethoxysilane, (epoxycyclohexyl)ethyldimethoxysilane, (epoxycyclohexyl)ethyldiethoxysilane, and a combination thereof. The examples of suitable unsaturated alkoxysilanes include vinyltrimethoxysilane, allyltrimethoxysilane, allyl-triethoxysilane, hexenyltrimethoxysilane, undecylenyl-trimethoxysilane, 3-methacryloyloxypropyltrimethoxysilane, 3-methacryloyloxypropyltriethoxysilane, 3-acryloyloxypropyltri-methoxysilane, 3-acryloyloxypropyltriethoxysilane, and a combination thereof.

Functional siloxanes may likewise be used as adhesion promoters. The siloxane corresponds to the reaction product of a hydroxy-terminated polyorganosiloxane with one or more of the above-described alkoxysilanes or with a blend of the hydroxy-terminated polyorganosiloxane with one or more of the abovementioned functional silanes. For example, a mixture of 3-glycidyloxypropyltrimethoxysilane and the reaction product of hydroxy-terminated methylvinylsiloxane and 3-glycidyloxypropyltrimethoxysilane may be used.

These components may also be used in the form of a physical mixture rather than a reaction product.

Furthermore, partial hydrolyzates of the functional silanes described above may be used as adhesion promoters. They are typically prepared either by the reaction of the silane with water and subsequent preparation of the mixture, or by preparation of the mixture with subsequent partial hydrolysis.

If the adhesion regulator (A) used is a release agent, then it is possible in principle to use all compounds which are known according to the prior art as release agents.

Suitable release agents are nonfunctional polydimethylsiloxanes, referred to as silicone fluids, phenyl-containing polydimethylsiloxanes, polydimethylsiloxanes containing fluorinated or partly fluorinated groups, fatty acids and their metal salts, fatty acid esters of saturated or unsaturated fatty acids, polyhaloolefins such as, for example, polytetrafluoroethylene, or inorganic compounds (e.g., calcium phosphate, titanium nitride, boron nitride).

Examples of phenyl-substituted polydimethylsiloxanes as release agents are the following:
diphenylsiloxane-dimethylsiloxane copolymers: CAS [68083-14-7]
phenylmethylsiloxane-dimethylsiloxane copolymers: CAS [63148-52-7]
phenylmethylsiloxane homopolymers: CAS [9005-12-3]

phenylmethylsiloxane-diphenylsiloxane copolymers
1,1,5,5-tetraphenyl-1,3,3,5-tetramethyltrisiloxane: CAS [3982-82-9]
1,1,3,5,5-pentaphenyl-1,3,5-trimethyltrisiloxane: CAS 3390-61-2
alkylmethylsiloxane-arylalkylmethylsiloxane copolymers: CAS [68037-77-4], [68952-01-2], [68440-89-1], [68037-76-3]
vinyl-terminal diphenylsiloxane-dimethylsiloxane copolymer: CAS [68951-96-2]
vinyl-terminal polyphenylmethylsiloxane: CAS [225927-21-9]vinylphenylmethyl-terminal vinylphenyl-phenylmethylsiloxane
copolymer: CAS [8027-82-1]
polyethylhydrogensiloxanes: CAS [24979-95-1]
methylhydrogen-phenylmethylsiloxane copolymers, SiH-terminated: CAS [115487-49-5],
methylhydrogen-phenylmethylsiloxane copolymers, Me3-Si-terminated
methylhydrogen-phenylmethyl-dimethylsiloxane copolymers
silanol-terminated diphenylsiloxane-dimethylsiloxane copolymers: CAS [68951-93-9], [68083-14-7]
silanol-terminated polydiphenylsiloxanes: CAS [63148-59-4]

Examples of particularly suitable release agents are polydimethylsiloxanes which comprise fluorinated or partly fluorinated groups and which in addition to the fluorine-containing groups may include further functionalities such as vinyl groups or Si—H groups. Polydimethylsiloxanes containing aryl groups are likewise release agents in the sense of the invention. Preference is given to polydimethylsiloxanes which contain phenyl groups and which may contain other functional groups such as vinyl groups or Si—H groups. Likewise used as release agents are organic monocarboxylic acids, so-called fatty acids, and metal salts thereof. Examples of saturated organic monocarboxylic acids are hexanoic acid or caproic acid, heptanoic acid or enanthic acid, octanoic acid or caprylic acid, nonanoic acid or pelargonic acid, decanoic acid or capric acid, dodecanoic acid or lauric acid, tetradecanoic acid or myristic acid, pentadecanoic acid, hexadecanoic acid or palmitic acid, heptadecanoic acid or margaric acid, octadecanoic acid or stearic acid, nonadecanoic acid, eicosanoic acid or arachidic acid, docosanoic acid or behenic acid, tetracosanoic acid or lignoceric acid, hexacosanoic acid or cerotinic acid, octacosanoic acid or montanic acid, triacontanoic acid or melissic acid. Examples of unsaturated organic fatty acids are (10Z)-undeca-10-enoic acid or undecylenic acid, (9Z)-tetradeca-9-enoic acid or myristoleic acid, (9Z)-hexadeca-9-enoic acid or palmitoleic acid, (6Z)-octadeca-9-enoic acid or petroselinic acid, (9Z)-octadeca-9-enoic acid or oleic acid, (9E)-octadeca-9-enoic acid or elaidic acid, (11E)-octadeca-11-enoic acid or vaccenic acid, (13Z)-docosa-13-enoic acid or erucic acid, (9Z,12Z)-octadeca-9,12-dienoic acid or linoleic acid, (9Z,12Z,15Z-octadeca-9,12,15-trienoic acid or alpha-linolenic acid, (6Z,9Z,12Z)-octadeca-6,9,12-trienoic acid or gamma-linolenic acid, (8E,10E,12Z)-octadeca-8,10,12-trienoic acid or calendic acid, (9Z,11E,13Z)-octadeca-9,11,13-trienoic acid or punicic acid, (9Z,11E,13E)-octadeca-9,11,13-trienoic acid or alpha-eleostearic acid, (9E,11E,13E)-octadeca-9,11,13-trienoic acid or beta-eleostearic acid, (5Z,8Z,11Z,14Z)-eicosa-5,8,11,14-tetraenoic acid or arachidonic acid, (5Z,8Z,11Z,14Z,17Z)-eicosa-5,8,11,14,17-pentaenoic acid or timnodonic acid, (7Z,10Z,13Z,16Z,19Z)-docosa-7,10,13,16,19-pentaenoic acid or clupanodonic acid.

Examples of fluorine-containing polydimethylsiloxanes as release agents are the following:
poly(3,3,3-trifluoropropylmethylsiloxane): CAS [63148-56-1]
3,3,3-trifluoropropylmethylsiloxane-dimethylsiloxane copolymers: CAS [115361-68-7]
bis(tridecafluorooctyl)tetramethylsiloxane: CAS [71363-70-7]
vinyl-terminated trifluoropropylmethylsiloxane-dimethylsiloxane copolymers: CAS [68951-98-4]
vinyl-terminated diethylsiloxane-dimethylsiloxane copolymers
3,3,3-trifluoropropylmethylsiloxane-methylhydrogensiloxane copolymers
3,3,3-trifluoropropylmethylsiloxane-methylhydrogensiloxane-dimethylsiloxane copolymers
silanol-terminated polytrifluoropropylmethylsiloxane: CAS [68607-77-2]

Examples of salts of the fatty acids as release agents are lithium, sodium, potassium, magnesium, calcium, strontium, barium, zinc, or aluminum salts of the abovementioned fatty acids. Preferred are calcium salts and zinc salts of the fatty acids.

Examples of suitable fatty acid esters are methyl, ethyl, propyl, butyl, pentyl, hexyl, heptyl, octyl, nonyl, decyl, dodecyl, tetradecyl, pentadecyl, hexadecyl, heptadecyl, octadecyl, nonadecyl, eicosyl, docosanyl, tetracosyl, hexacosyl, octacosyl, or triacontanyl esters of the abovementioned acids. Unsaturated or branched fatty acid esters are also suitable for the application.

Preferred fatty acid esters are those which contain between 10 and 60 C atoms, and more preferably between 10 and 40 C atoms.

Other groups of substances suitable as release agents in the sense of the invention are polyhaloolefins such as, for example, polytetrafluoroethylene, or inorganic metal salts such as, for example, calcium phosphate, titanium nitride, boron nitride, etc.

Preferred for use as release agents are phenyl-substituted silicone fluids or fatty acid esters. Preference is further attached to those release agents which do not adversely affect the crosslinking reaction of the adhesive composition of the invention.

The release agents and adhesion promoters listed above as adhesion regulators (A) each have a specific solubility and miscibility behavior in the crosslinkable silicone composition that functions as adhesive. This behavior may vary within wide limits. For instance, the adhesion regulator may be perfectly soluble in the adhesive, corresponding to a mixture which is homogeneous at a molecular level. In general, however, owing to its physicochemical properties, the adhesion regulator (A) will have a reduced solubility in the adhesive composition, even if, viewed macroscopically, it can be dispersed or mixed homogeneously into the adhesive composition. The adhesion regulator (A) may also be completely incompatible with the adhesive composition, as evident, for example, from rapid-onset phase separation, nondispersibility, or instances of efflorescence and/or exudation effects. Depending on the degree of the incompatibility of the adhesion regulator (A) with the silicone matrix of the adhesive, therefore, the adhesion regulator (A) tends to migrate to the surface of the silicone material or else to form a mixture with microphase separation.

Surprisingly it has been found that even in the case of a homogeneous mixture consisting of adhesion regulator (A) and noncrosslinked silicone composition (=adhesive), the development of adhesion between adhesive and the $1^{st}$ substrate may be adjusted to be greater or weaker, depending on the choice of the added adhesion regulator (A), than the development of adhesion to the $2^{nd}$ substrate, even when $1^{st}$ and $2^{nd}$ substrates are completely identical in physicochemical terms. It has been observed that the three-dimensional position of the assembly to be formed from substrate 1, layer of adhesive, and substrate 2 plays an important part for the development of adhesion. Without wanting to restrict the scope of protection of the patent application, the obvious supposition is that a decisive role is adopted by the difference in density between the silicone composition and the adhesion regulator (A) that is used. For the case in which the adhesion regulator is an adhesion promoter: If, for example, the density of the adhesion regulator (A) ($\rho_{AR}$) is greater than that of the silicone composition ($\rho_s$), the adhesion is developed preferentially to the bottom substrate; if the density of the adhesion regulator (A) ($\rho_{AR}$) is lower than that of the silicone composition ($\rho_s$), the adhesion is developed preferentially to the top substrate. Similarly, for the case in which the adhesion regulator (A) is a release agent, in other words a substance which reduces the adhesion, the obvious supposition is that an admixed adhesion regulator (A) reduces the adhesion of the top substrate if the density of the adhesion regulator (A) is lower than that of the silicone composition. If in this case the density of the adhesion regulator (A) is higher than that of the silicone composition, the adhesive force to the lower substrate is diminished.

A combination of at least one adhesion promoter and at least one release agent may also be used as adhesion regulator (A) in order to achieve the desired effect of selective adhesion. In this case it is an advantage for the adhesion promoter to have a higher density and the release agent a lower density, for example, than the silicone composition, or for the release agent to possess a higher density and the adhesion promoter a lower density than the silicone composition. The minimum density difference between adhesion regulator (A) and the silicone composition is considered to be about 0.10 g/cm$^3$.

The density of the adhesive is critically altered by the nature and amount of any filler present (and in general is increased). If the fillers in question are very finely divided fillers, then the density change resulting from the filler leads in fact to an altered adhesion behavior. If, on the other hand, the fillers are very coarsely particulate, they do in fact bring about a macroscopic density change, but without significantly affecting the adhesion behavior, which is based on the density difference between the fluid constituents of the silicone composition and the adhesion regulator (A). Without thereby restricting the scope of protection, the limit between fillers that are finely divided and coarsely particulate in this sense may be drawn at an average particle diameter of about 1 μm.

Furthermore, any fillers present may influence the migration behavior of the adhesion regulator (A), which constitutes a basis for the adhesion behavior, by absorbing or adsorbing the adhesion regulator (A) on the filler surface. This unwanted effect can, however, be avoided by selection of suitable fillers.

The silicone compositions described may optionally comprise all other adjuvants which have also been used to date in order to produce crosslinkable silicone compositions. Examples of reinforcing fillers which can be used as a component in the silicone compositions of the invention are fumed or precipitated silicas having BET surface areas of at least 50 m$^2$/g and also carbon blacks and activated carbons such as furnace black and acetylene black, preference being given to fumed and precipitated silicas having BET surface areas of at least 50 m$^2$/g. The stated silica fillers may be hydrophilic in character or may have been hydrophobized by known processes. If hydrophilic fillers are incorporated, it is necessary to add a hydrophobizing agent. The amount of actively reinforcing filler in the crosslinkable composition of the invention is in the range from 0 to 70 wt %, preferably at 0 to 50 wt %.

The silicone composition of the invention may as a matter of selection include, as constituents, further additives, in a fraction of up to 70 wt %, preferably 0.0001 to 40 wt %. These additives may be, for example, inert fillers, resinous polyorganosiloxanes different from the crosslinking polysiloxanes, reinforcing and nonreinforcing fillers, fungicides, fragrances, rheological additives, corrosion inhibitors, oxidation inhibitors, light stabilizers, flame retardants, and agents for influencing the electrical properties, dispersing assistants, solvents, pigments, dyes, plasticizers, organic polymers, heat stabilizers, etc. They include additives, such as finely ground quartz, diatomaceous earth, clays, talc, chalk, lithopone, carbon blacks, graphite, metal oxides, metal carbonates, metal sulfates, metal salts of carboxylic acids, metal dusts, fibers, such as glass fibers, polymeric fibers, polymeric powders, dyes, pigments, etc.

These fillers may, moreover, be heat-conducting or electrically conducting. Examples of heat-conducting fillers are aluminum nitride; aluminum oxide; barium titanate; beryllium oxide; boron nitride; diamond; graphite; magnesium oxide; particulate metal such as, for example, copper, gold, nickel, or silver; silicon carbide; tungsten carbide; zinc oxide, and a combination thereof. Heat-conducting fillers are known in the prior art and available commercially. For example, CB-A20S and Al-43-Me are aluminum oxide fillers in various particle sizes, which are available commercially from Showa-Denko, and AA-04, AA-2, and AA1 8 are aluminum oxide fillers which are available commercially from Sumitomo Chemical Company. Silver fillers are available commercially from Metalor Technologies U.S.A. Corp. of Attleboro, Mass., U.S.A. Boron nitride fillers are available commercially from Advanced Ceramics Corporation, Cleveland, Ohio, U.S.A. The reinforcing fillers include silica and short fibers such as, for example, KEVLAR-Kurzfaser®. A combination of fillers with different particle sizes and different particle size distributions may be used.

The adhesive may further comprise one or more optional components, subject to the proviso that the optional component has no adverse consequence for the curing of the adhesive formulation during the method of the present invention. The examples of optional components include, among others, one or more solvents, one or more inhibitors, spacers.

Where the adhesive comprises solvent, it should be ensured that the solvent has no deleterious effects on the system as a whole. Suitable solvents are known in the prior art and available commercially. The solvent may, for example, be an organic solvent having 3 to 20 carbon atoms. The examples of solvents include aliphatic hydrocarbons such as heptane, octane, iso-octanes, nonane, decane, undecane, and dodecane; aromatic hydrocarbons such as mesitylene, xylene, and toluene, for example; esters such as ethyl acetate and butyrolactone, for example; ethers such as n-butyl ether and polyethylene glycol monomethyl ether, for example; ketones such as methyl isobutyl ketone and methyl pentyl ketone, for example; silicone fluid such as linear, branched, and cyclic polydimethylsiloxanes, for example, and combinations of these solvents. The optimum concentration of a particular solvent in an adhesive formulation may be determined readily by means of routine experiments. Depending on the weight of the compound, the amount of the solvent may be between 0% and 95% or between 1% and 95%.

Where inhibitors and stabilizers are included, they serve for targeted adjustment of the processing life, onset temperature, and crosslinking rate of the silicone compositions of the invention. These inhibitors and stabilizers are very well known in the field of addition-crosslinking compositions. Examples of customary inhibitors are acetylenic alcohols, such as 1-ethynyl-1-cyclohexanol, 2-methyl-3-butyn-2-ol, and 3,5-dimethyl-1-hexyn-3-ol, 3-methyl-1-dodecyn-3-ol, polymethyl-vinylcyclosiloxanes such as 1,3,5,7-tetravinyltetramethyltetra-cyclosiloxane, low molecular mass silicone fluids with methylvinyl-$SiO_{1/2}$ groups and/or $R_2vinylSiO_{1/2}$ end groups, such as divinyltetramethydisiloxane, tetravinyldimethyldisiloxane, trialkyl cyanurates, alkyl maleates, such as diallyl maleates, dimethyl maleate, and diethyl maleate, alkyl fumarates, such as diallyl fumarate and diethyl fumarate, organic hydroperoxides such as cumene hydroperoxide, tert-butyl hydroperoxide, and pinane hydroperoxide, organic peroxides, organic sulfoxides organic amines, diamines and amides, phosphanes and phosphites, nitriles, triazoles, diaziridines, and oximes. The effect of these inhibitor additives depends on their chemical structure, and so the concentration must be determined individually. Inhibitors and inhibitor mixtures are added preferably in a proportion of 0.00001% to 5%, based on the total weight of the mixture, more preferably 0.00005% to 2%, and very preferably 0.0001% to 1%.

If spacers are included, they may consist of organic particles, inorganic particles, or a combination thereof. Spacers may be heat-conducting, electrically conducting, or both. Spacers may have a particle size of at least 25 up to 250 micrometers. Spacers may comprise monodisperse beads. Examples of spacers include polystyrene, glass, perfluorinated hydrocarbon polymers, and a combination thereof. Spacers may be added in addition to or instead of the filler or parts thereof.

The use of crosslinkable adhesive in accordance with the invention has the advantage that the adhesive can be produced in a simple method using readily available starting materials and hence economically. The adhesives used in accordance with the invention have the further advantage that as a one-component formulation they have a good shelf life at 25° C. and ambient pressure, and crosslink rapidly only at elevated temperature. The adhesives used in accordance with the invention have the advantage that in the case of the two-component formulation, after mixing of the two components, they produce a crosslinkable silicone material whose processability is retained over a long time period at 25° C. and ambient pressure, therefore exhibiting extremely long pot life, and crosslinks rapidly only at elevated temperature.

A further subject of the invention is the method for the temporary adhesive bonding of two chemically similar substrates, characterized in that
 a) an adhesive is applied to the substrate 1,
 b) a waiting time of 10 seconds to 120 minutes is observed,
 c) any solvent present is removed during the aforementioned waiting time b),
 d) substrate 2 is contacted with the adhesive,
 e) curing of the adhesive takes place,
 f) implementation of further working steps on substrate 1 and/or substrate 2,
 g) separation of the substrates, with the cured adhesive remaining on one of the two substrates,
the adhesive being a crosslinkable silicone composition which is characterized in that it comprises at least one adhesion regulator (A) selected from the group containing adhesion promoters or release agents or a combination thereof, with the proviso that the adhesion regulator (A) is present in amounts such that the adhesive force between the cured adhesive and a substrate is greater by at least 0.5 N/mm than the adhesive force between the cured adhesive and the other substrate, measured according to DIN ISO 813, and the cured adhesive can be parted adhesively on at least 80% of the area only from one substrate when the bond is parted.

In one preferred embodiment, substrate 1 is a silicon wafer and substrate 2 is a silicon support.

In the unvulcanized state the adhesives of the invention have a viscosity of between 0.01 and 50 Pa·s.

The difference in mass of the adhesive in a thermogravimetric analysis (TGA) at a heating rate of 10 K/min to 300° C. is not more than 0.5 wt %.

A standard specimen of the cured adhesive with a thickness of 6 mm of the adhesive formulation has a Shore A hardness of between 10 and 95, preferably between 30 and 90, and more preferably between 40 and 80.

If necessary, the electrical resistance of the cured adhesive can be reduced by suitable additives, in order to prevent electrostatic charging and discharging in the course of delamination. For this purpose it is possible to use the prior-art antistats and conductivity-enhancing additives. The electrical resistivity of the cured adhesive used is less than $1*10^{15}\Omega$ cm, preferably less than $1*10^{14}\Omega$ cm, at room temperature.

The dynamic viscosity of the uncured adhesive is between 50 and 10,000 mPa·s at room temperature and a shear rate of $1\ s^{-1}$.

The ratio of the dynamic viscosities of the uncured adhesive used at the shear rates of $1\ S^{-1}$ and $100\ S^{-1}$ at room temperature is less than 3, preferably less than 2, and more preferably less than 1.2.

An advantage of the adhesive used is that it can be ground by conventional technologies.

EXAMPLES

In the examples described below, all data for parts and percentages, unless otherwise indicated, are by weight. Unless otherwise indicated, the examples below are carried out under the pressure of the surrounding atmosphere, in other words approximately at 1000 hPa, and at room temperature, in other words at about 20° C., or at a temperature which is established when the reactants are combined at room temperature without additional heating or cooling. All viscosity data below relate to a temperature of 25° C. The examples which follow illustrate the invention, without having any restrictive effect in this context.

The adhesive force is determined in accordance with DIN ISO 813 and is reported in N/mm. The separation mode is assessed using the following symbols:

R separation in the elastomer (cohesive fracture)

D separation between elastomer and support plate (adhesive fracture on at least 80% of the area)

The following abbreviations are used:

Cat. platinum catalyst

Ex. example

No. number $\rho_s$ density of silicone composition $\rho_{HR}$ density of adhesion regulator PDMS polydimethylsiloxane AR adhesion regulator n.i. not inventive

Example 1

Silicone Base Composition 1

100 parts of vinyl-terminated PDMS with an average chain length of about 220
3 parts of an SiH crosslinker capable of fully crosslinking the polymer
100 ppm of 1-ethynylcyclohexanol
10 ppm of platinum catalyst, based on the metal
Density: 0.97 g/cm$^3$

Example 2

Silicone Base Composition 2

100 parts of vinyl-terminated PDMS with an average chain length of about 220
40 parts of a prehydrophobized fumed silica having a BET surface area of about 300 m$^2$/g
3 parts of an SiH crosslinker capable of fully crosslinking the polymer
100 ppm of 1-ethynylcyclohexanol
10 ppm of platinum catalyst, based on the metal
Density: 1.12 g/cm$^3$

Example 3

Silicone base composition 3

100 parts of vinyl-terminated PDMS with an average chain length of about 220
50 parts of a spherical aluminum oxide having an average particle diameter of 25 μm
3 parts of an SiH crosslinker capable of fully crosslinking the polymer
100 ppm of 1-ethynylcyclohexanol
10 ppm of platinum catalyst, based on the metal
Density: 0.97 g/cm$^3$ (disregarding the Al oxide)

Example 4

Silicone Base Composition 4

100 parts of an MQ resin containing vinyl groups
30 parts of vinyl-terminated PDMS with an average chain length of about 100
3 parts of an SiH crosslinker capable of fully crosslinking the polymer
100 ppm of 1-ethynylcyclohexanol
10 ppm of platinum catalyst, based on the metal
Density: 1.08 g/cm$^3$

Example 5

Silicone Base Composition 5

100 parts of an MQ resin containing vinyl groups
50 parts of vinyl-terminated PDMS with an average chain length of about 100
7 parts of an SiH crosslinker capable of fully crosslinking the polymer
100 ppm of 1-ethynylcyclohexanol
10 ppm of platinum catalyst, based on the metal
Density: 1.07 g/cm$^3$ The following listing shows the adhesion regulators used, which were added in a concentration of 3 wt %, based on the silicone composition, as additive:

| Adhesion regulator | Chemical name | Density | CAS number |
|---|---|---|---|
| AR 1 | Vinyltrimethoxysilane | 0.97 | [2768-02-7] |
| AR 2 | Vinyltriethoxysilane | 0.91 | [78-08-0] |
| AR 3 | (3-Glycidyloxypropyl)trimethoxysilane | 1.07 | [2530-83-8] |
| AR 4 | (3-Methacryloyloxypropyl)trimethoxysilane | 1.05 | [2530-85-0] |
| AR 5 | (Methacryloyloxymethyl)triethoxysilane | 1 | [5577-72-0] |
| AR 6 | 3-(Triethoxysilyl)propylsuccinic anhydride | 1.09 | [93642-68-3] |
| AR 7 | Vinyl-terminal polyphenylmethylsiloxane, M = 2000-3000 | 1.11 | [225927-21-9] |
| AR 8 | Methylhydrogen-phenylmethylsiloxane copolymers, SiH-terminated, M = 500 | 1.08 | [115487-49-5] |
| AR 9 | Phenylmethylsiloxane-dimethylsiloxane copolymer, trimethylsilyl-terminated, M = 3000 | 1.0 | [63148-52-7] |
| AR 10 | Poly(3,3,3-trifluoropropylmethylsiloxane), trimethylsilyl-terminated, M = 4600 | 1.28 | [63148-56-1] |
| AR 11 | Trifluoropropylmethylsiloxane-dimethylsiloxane copolymer, vinylmethyl-terminated, M = 30 000 | 1.12 | [68951-98-4] |
| AR 12 | Stearyl heptanoate | 0.86 | [66009-41-4] |
| AR 13 | Stearyl caprylate | 0.86 | [18312-31-7] |
| AR 14 | Cetearyl ethylhexanoate | 0.85 | [59130-69-7] |
| AR 15 | Isopropyl myristate | 0.85 | [110-27-0] |

Tables 1 to 4 show Examples 6 to 90. They show which adhesion regulators were mixed into which silicone base composition and tested for their adhesive force. For achieving the described effect, however, mixtures of the stated substances may also be used. Used as substrate 1 is a polished silicon wafer; substrate 2 represents a galvanized steel; and substrate 3 is an aluminum sheet. During crosslinking (15 min at 165° C.), the substrate is brought on the one hand below the silicone composition (corresponds to adhesive force bottom) and on the other hand is placed onto the silicone composition (corresponds to adhesive force top).

TABLE 1

| Ex. | Silicone base composition | $\rho_s$ | Substrate | Adhesion regulator | $\rho_{AR}$ | Adhesive force top [N/mm] | Adhesive force bottom [N/mm] |
|---|---|---|---|---|---|---|---|
| 6 (n.i.) | 1 | 0.97 | 1 | — | — | <1 D | <1 D |
| 7 (n.i.) | 2 | 1.12 | 1 | — | — | 2 D | 2 D |
| 8 (n.i.) | 3 | 0.97 | 1 | — | — | <1 D | <1 D |
| 9 (n.i.) | 4 | 1.08 | 1 | — | — | <1 D | <1 D |
| 10 (n.i.) | 5 | 1.07 | 1 | — | — | <1 D | <1 D |
| 11 | 1 | 0.97 | 1 | AR 1 | 0.97 | 2 D | 2 D |
| 12 | 2 | 1.12 | 1 | AR 1 | 0.97 | 5 R | 3.5 D |
| 13 | 3 | 0.97 | 1 | AR 1 | 0.97 | 3 R | 3 R |
| 14 | 4 | 1.08 | 1 | AR 1 | 0.97 | 3 R | 2.5 D |
| 15 | 5 | 1.07 | 1 | AR 1 | 0.97 | 3 R | 2.5 R |
| 16 | 1 | 0.97 | 1 | AR 2 | 0.91 | 2.5 R | 2.5 R |
| 17 | 2 | 1.12 | 1 | AR 2 | 0.91 | 5.5 R | 3 D |
| 18 | 3 | 0.97 | 1 | AR 2 | 0.91 | 3 R | 3 R |
| 19 | 4 | 1.08 | 1 | AR 2 | 0.91 | 3.5 R | 2.5 D |
| 20 | 5 | 1.07 | 1 | AR 2 | 0.91 | 3.5 R | 2.5 D |
| 21 | 1 | 0.97 | 1 | AR 3 | 1.07 | 6 R | 8.5 R |
| 22 | 2 | 1.12 | 1 | AR 3 | 1.07 | 5 R | 5 R |

TABLE 1-continued

| Ex. | Silicone base composition | $\rho_s$ | Substrate | Adhesion regulator | $\rho_{AR}$ | Adhesive force top [N/mm] | Adhesive force bottom [N/mm] |
|---|---|---|---|---|---|---|---|
| 23 | 3 | 0.97 | 1 | AR 3 | 1.07 | 5 R | 6 R |
| 24 | 4 | 1.08 | 1 | AR 3 | 1.07 | 7 R | 7 R |
| 25 | 5 | 1.07 | 1 | AR 3 | 1.07 | 7 R | 7 R |
| 26 | 1 | 0.97 | 1 | AR 4 | 1.05 | 2.5 D | 4 R |
| 27 | 2 | 1.12 | 1 | AR 4 | 1.05 | 3 R | 3 R |

TABLE 2

| Ex. | Silicone base composition | $\rho_s$ | Substrate | Adhesion regulator | $\rho_{AR}$ | Adhesive force top [N/mm] | Adhesive force bottom [N/mm] |
|---|---|---|---|---|---|---|---|
| 28 | 3 | 0.97 | 1 | AR 4 | 1.05 | 3 D | 4 R |
| 29 | 4 | 1.08 | 1 | AR 4 | 1.05 | 3.5 R | 3.5 R |
| 30 | 5 | 1.07 | 1 | AR 4 | 1.05 | 3.5 R | 3.5 R |
| 31 | 1 | 0.97 | 1 | AR 5 | 1.0 | 2 D | 2 D |
| 32 | 2 | 1.12 | 1 | AR 5 | 1.0 | 3 D | 2 D |
| 33 | 3 | 0.97 | 1 | AR 5 | 1.0 | 3 R | 3 R |
| 34 | 4 | 1.08 | 1 | AR 5 | 1.0 | 3 R | 3 R |
| 35 | 5 | 1.07 | 1 | AR 5 | 1.0 | 3 R | 3 R |
| 36 | 1 | 0.97 | 1 | AR 6 | 1.09 | 4 D | 5 R |
| 37 | 2 | 1.12 | 1 | AR 6 | 1.09 | 3 D | 3 D |
| 38 | 3 | 0.97 | 1 | AR 6 | 1.09 | 3 D | 4 R |
| 39 | 4 | 1.08 | 1 | AR 6 | 1.09 | 2 D | 2 D |
| 40 | 5 | 1.07 | 1 | AR 6 | 1.09 | 2 D | 2 D |
| 41 | 1 | 0.97 | 1 | AR 7 | 1.11 | 5 D | 7 R |
| 42 | 2 | 1.12 | 1 | AR 7 | 1.11 | 3 D | 3 D |
| 43 | 3 | 0.97 | 1 | AR 7 | 1.11 | 3 D | 4 R |
| 44 | 4 | 1.08 | 1 | AR 7 | 1.11 | 2 D | 2 D |
| 45 | 5 | 1.07 | 1 | AR 7 | 1.11 | 2 D | 2 D |
| 46 | 1 | 0.97 | 1 | AR 8 | 1.08 | 4.5 D | 6 R |
| 47 | 2 | 1.12 | 1 | AR 8 | 1.08 | 3 R | 3 R |
| 48 | 3 | 0.97 | 1 | AR 8 | 1.08 | 3 D | 5.5 R |
| 49 | 4 | 1.08 | 1 | AR 8 | 1.08 | 5 R | 5 R |
| 50 | 5 | 1.07 | 1 | AR 8 | 1.08 | 4.5 R | 4.5 R |
| 51 | 1 | 0.97 | 1 | AR 9 | 1.0 | 3 D | 3 D |
| 52 | 2 | 1.12 | 1 | AR 9 | 1.0 | 3 D | 2 D |

TABLE 3

| Ex. | Silicone base composition | $\rho_s$ | Substrate | Adhesion regulator | $\rho_{AR}$ | Adhesive force top [N/mm] | Adhesive force bottom [N/mm] |
|---|---|---|---|---|---|---|---|
| 53 | 3 | 0.97 | 1 | AR 9 | 1.0 | 4 D | 4 D |
| 54 | 4 | 1.08 | 1 | AR 9 | 1.0 | 3 R | 3 R |
| 55 | 5 | 1.07 | 1 | AR 9 | 1.0 | 3.5 R | 3.5 R |
| 56 | 1 | 0.97 | 1 | AR 10 | 1.28 | 2 D | 4 D |
| 57 | 2 | 1.12 | 1 | AR 10 | 1.28 | 2.5 D | 5 R |
| 58 | 3 | 0.97 | 1 | AR 10 | 1.28 | 1.5 D | 4 D |
| 59 | 4 | 1.08 | 1 | AR 10 | 1.28 | <1 D | 4 R |
| 60 | 5 | 1.07 | 1 | AR 10 | 1.28 | <1 D | 4 R |
| 61 | 1 | 0.97 | 1 | AR 11 | 1.12 | 4 R | 3 D |
| 62 | 2 | 1.12 | 1 | AR 11 | 1.12 | 5 R | 5 R |
| 63 | 3 | 0.97 | 1 | AR 11 | 1.12 | 5 R | 4 R |
| 64 | 4 | 1.08 | 1 | AR 11 | 1.12 | 3 R | 3 R |
| 65 | 5 | 1.07 | 1 | AR 11 | 1.12 | 3 R | 3 R |
| 66 | 1 | 0.97 | 1 | AR 12 | 0.86 | 3 R | <1 D |
| 67 | 2 | 1.12 | 1 | AR 12 | 0.86 | 4 R | <1 D |
| 68 | 3 | 0.97 | 1 | AR 12 | 0.86 | 4 R | <1 D |
| 69 | 4 | 1.08 | 1 | AR 12 | 0.86 | 3 R | <1 D |
| 70 | 5 | 1.07 | 1 | AR 12 | 0.86 | 3 R | <1 D |
| 71 | 1 | 0.97 | 1 | AR 13 | 0.86 | 3.5 R | <1 D |
| 72 | 2 | 1.12 | 1 | AR 13 | 0.86 | 3.5 R | <1 D |
| 73 | 3 | 0.97 | 1 | AR 13 | 0.86 | 4 R | <1 D |
| 74 | 4 | 1.08 | 1 | AR 13 | 0.86 | 4 R | <1 D |
| 75 | 5 | 1.07 | 1 | AR 13 | 0.86 | 3 R | <1 D |
| 76 | 1 | 0.97 | 1 | AR 14 | 0.85 | 3.5 R | <1 D |
| 77 | 2 | 1.12 | 1 | AR 14 | 0.85 | 3.5 R | <1 D |

TABLE 4

| Ex. | Silicone base composition | $\rho_s$ | Substrate | Adhesion regulator | $\rho_{AR}$ | Adhesive force top [N/mm] | Adhesive force bottom [N/mm] |
|---|---|---|---|---|---|---|---|
| 78 | 3 | 0.97 | 1 | AR 14 | 0.85 | 4 R | <1 D |
| 79 | 4 | 1.08 | 1 | AR 14 | 0.85 | 4 R | <1 D |
| 80 | 5 | 1.07 | 1 | AR 14 | 0.85 | 3 R | <1 D |
| 81 | 1 | 0.97 | 1 | AR 14 | 0.85 | 3.5 R | <1 D |
| 82 | 2 | 1.12 | 1 | AR 14 | 0.85 | 3.5 R | <1 D |
| 83 | 3 | 0.97 | 1 | AR 14 | 0.85 | 4 R | <1 D |
| 84 | 4 | 1.08 | 1 | AR 14 | 0.85 | 4 R | <1 D |
| 85 | 5 | 1.07 | 1 | AR 14 | 0.85 | 3 R | <1 D |
| 86 | 5 | 1.07 | 2 | AR 13 | 0.86 | 5 R | <1 D |
| 87 | 5 | 1.07 | 1 | AR 12 + AR 13 | 0.86 | 4 R | <1 D |
| 88 | 5 | 1.07 | 2 | AR 12 | 0.86 | 3.5 R | <1 D |
| 89 | 5 | 1.07 | 3 | AR 13 | 0.86 | 6 R | <1 D |
| 90 | 5 | 1.07 | 3 | AR 12 | 0.86 | 5.5 R | <1 D |

The invention claimed is:

1. A process for the temporary adhesive bonding of a silicon wafer to a silicon support, comprising applying an adhesive to the support, wherein
the adhesive is a crosslinkable silicone composition comprising at least 0.01 to 10 wt % of at least one release agent selected from the group consisting of fatty acids and their metal salts, fatty acid esters of saturated or unsaturated fatty acids, and combinations thereof, and bonding the silicon wafer to the support by the adhesive, wherein the release agent has at least a density difference of 0.10 g/cm$^3$ as compared with the density of the silicone composition and as a result the adhesive force between the cured adhesive and the silicon support is greater by at least 0.5 N/mm than the adhesive force between the cured adhesive and the silicon wafer, measured according to DIN ISO 813, and the cured adhesive can be parted adhesively from at least 80% of the area of the silicon wafer on parting of a bond between the silicon wafer and the silicon support.

2. The process of claim 1, wherein the crosslinkable silicone composition is selected from the group consisting of condensation-crosslinking, addition-crosslinking, and peroxidically crosslinking silicone compositions.

3. A method for the temporary adhesive bonding of a silicon wafer to a silicon support, comprising:
a) applying an adhesive to a silicon wafer, wherein the adhesive is a crosslinkable silicone composition comprising at least 0.01 to 10 wt % of at least one release agent selected from the group consisting of fatty acids and their metal salts, fatty acid esters of saturated or unsaturated fatty acids, and combinations thereof, wherein the release agent has at least a density difference of 0.10 g/cm$^3$ as compared with the density of the silicone composition and as a result the adhesive force between the cured adhesive and the silicon support is greater by at least 0.5 N/mm than the adhesive force between the cured adhesive and the silicon wafer, measured according to DIN ISO 813, and the cured adhesive can be parted adhesively from at least 80% of the area of the silicon wafer on parting of a bond between the silicon wafer and the silicon support,
b) observing a waiting time of 10 seconds to 120 minutes wherein any solvent present is removed during the waiting time,
d) contacting the silicon support with the adhesive,
e) curing the adhesive,
f) implementing further working steps on the silicon wafer and/or the silicon support,
g) separating the silicon wafer and silicon support, with the cured adhesive remaining on the silicon support.

4. A method for the temporary adhesive bonding of a silicon wafer to a silicon support, comprising:
a) applying an adhesive to a silicon wafer, wherein the adhesive is a crosslinkable silicone composition comprising at least 0.01 to 10 wt % of at least one release agent selected from the group consisting of fatty acids and their metal salts, fatty acid esters of saturated or unsaturated fatty acids, and combinations thereof,
wherein the release agent has at least a density difference of 0.10 $g/cm^3$ as compared with the density of the silicone composition and as a result the adhesive force between the cured adhesive and the silicon support is greater by at least 0.5 N/mm than the adhesive force between the cured adhesive and the silicon wafer, measured according to DIN ISO 813, and the cured adhesive can be parted adhesively from at least 80% of the area of the silicon wafer on parting of a bond between the silicon wafer and the silicon support,
b) observing a waiting time of 10 seconds to 120 minutes wherein any solvent present is removed during the waiting time,
d) contacting the silicon support with the adhesive,
e) curing the adhesive,
f) implementing further working steps on the silicon wafer and/or the silicon support,
g) separating the silicon wafer and silicon support, with the cured adhesive remaining on the silicon support,
wherein the crosslinkable silicone composition is selected from the group consisting of condensation-crosslinking, addition-crosslinking, and peroxidically crosslinking silicone compositions.

* * * * *